(12) United States Patent
Gleason et al.

(10) Patent No.: US 6,390,904 B1
(45) Date of Patent: May 21, 2002

(54) RETAINERS AND NON-ABRASIVE LINERS USED IN CHEMICAL MECHANICAL POLISHING

(75) Inventors: Allan Gleason, San Jose; Manoocher Birang, Sarasota; John Prince, Los Altos; Mohsen Salek, Cupertino; Syed Askari, Santa Clara, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/082,891

(22) Filed: May 21, 1998

(51) Int. Cl.[7] ................ B24B 5/00; C23F 1/02
(52) U.S. Cl. ............ 451/286; 156/345; 451/285; 451/289
(58) Field of Search .......... 156/345; 427/331, 427/386; 428/404; 451/285, 286, 289; 216/88

(56) References Cited

U.S. PATENT DOCUMENTS

| | | | |
|---|---|---|---|
| 5,533,924 A | | 7/1996 | Stroupe et al. ............ 451/286 |
| 5,633,086 A | * | 5/1997 | Hsu et al. ................ 428/404 |
| 5,635,083 A | * | 6/1997 | Breivogel et al. .......... 216/88 |
| 5,664,988 A | * | 9/1997 | Stroupe et al. ............ 451/41 |
| 5,738,574 A | | 4/1998 | Tolles et al. |
| 5,795,215 A | * | 8/1998 | Guthrie et al. ............ 451/286 |

OTHER PUBLICATIONS

"Guide to Plastics", Craftech® Industries, Inc. Hudson, New York.

* cited by examiner

Primary Examiner—George Goudreau
(74) Attorney, Agent, or Firm—Moser, Patterson & Sheridan

(57) ABSTRACT

The present invention provides a retaining ring having an resilient liner for protecting the substrate edge from being damaged during chemical mechanical polishing and a method for making the same. Retainers made of wear resistant ceramics, such as alumina, provide better overall performance, including wear resistance, and reduced particle formation than other retaining ring materials. By incorporating a resilient liner, such as an epoxy, on the inner surface of the wear resistant ring, the substrate edge is protected from damage that can be easily caused by the hard surface of the ceramic alone.

25 Claims, 9 Drawing Sheets

| SAMPLE | MATERIAL | HARDNESS | WEAR RATE (MICRON/MIN.) |
|---|---|---|---|
| 1. | DERIN 500 AF (ACETALS) | SHORE D 89 | 2.3 |
| 2. | DELRIN 500 CL (ACETALS) | SHORE D 92 | 2.3 |
| 3. | G10 (GLASS FILLED EPOXY) | SHORE D 94 | 0.2 |
| 4. | NP510A (GLASS FILLED EPOXY) | SHORE D 94 | |
| 5. | HYDLAR Z | SHORE D 94 | 0.2 |
| 6. | ZYTEL | M94, R120 | 0.2 |
| 7. | POLYMIDE (VESPEL) SP1 | SHORE D 89 | 0.1 |
| 8. | POLYIMIDE SP21 | SHORE D 88 | 0.1 |
| 9. | POLYIMIDE SP211 | SHORE D 83 | 0.1 |
| 10. | POLYIMIDE SP3 | SHORE D 92 | 0.3 |
| 11. | PEEK (POLYETHERETHERKETONE) | SHORE D 94 | 0.4 |
| 12. | TORLON 4203 (POLYAMIDEIMIDE) | SHORE D 94 | <0.4 |
| 13. | NYLON | SHORE D 88 | 0.4 |
| 14. | PET | SHORE D 88 | 0.9 |
| 15. | ULTEM (POLYETHERIMIDE) | SHORE D 90 | >5 |
| 16. | KYNOR (POLYNINYLEDENE FLUORIDE) | SHORE D 82 | $\geq 5$ |
| 17. | POLYCARBONATE | SHORE D 86 | $\geq 5$ |
| 18. | PBT | SHORE D 85 | $\geq 5$ |
| 19. | TTUPG | SHORE D 85 | $\geq 5$ |
| 20. | UHMWPE | SHORE D 92 | $\geq 5$ |
| 21. | DURATRON | SHORE D 94 | 5 |
| 22. | TECHTRON (POLYPHENYLENE SULPHIDE) | SHORE D 91 | .3 |
| 23. | PEEK WITH CARBON | SHORE D 92 | <0.1 |
| 24. | TORLON 4201 | SHORE D 94 | <0.1 |
| 25. | POLYURETHANE | SHORE D 88 | |
| 26. | HYTREL | SHORE D 89 | |

*Fig. 6*

RETAINERS AND NON-ABRASIVE LINERS USED IN CHEMICAL MECHANICAL POLISHING

BACKGROUND OF THE INVENTION

1. Field of the Invention

The present invention relates to chemical mechanical polishing of substrates, and more particularly to wear resistant retainers that restrict lateral movement of substrates during polishing without damaging the substrate and provide improved edge exclusion.

2. Background of the Art and Summary of Invention

Integrated circuits are typically formed on substrates, particularly silicon wafers, by the sequential deposition of conductive, semi-conductive or insulative layers. After each layer is deposited, the layer is typically etched to create circuitry features. As a series of layers are sequentially deposited and etched, the uppermost layer on the substrate, i.e., the exposed surface of the substrate, may become nonplanar across its surface and require planarization. This occurs when the thickness of the layers formed on the substrate varies across the substrate surface as a result of the nonuniform geometry of the circuits formed thereon. In applications having multiple patterned underlying layers, the height difference between the peaks and valleys becomes even more severe, and can approach several microns.

Chemical mechanical polishing (CMP) is one accepted method of planarization. In a typical CMP system as shown in FIG. 1, a substrate 12 is placed face down on a polishing pad 14 located on a large rotatable platen 16. A carrier 18 holds the substrate and applies pressure to the back of the substrate to hold the substrate against the polishing pad during polishing. A retaining ring 20 is typically disposed around the outer perimeter of the substrate to prevent the substrate from slipping laterally during polishing. During polishing, a slurry comprising a reactive agent and abrasive particles is delivered to the polishing pad to chemically passivate or oxidize the film being polished and abrasively remove or polish off the surface of the film. A reactive agent in the slurry reacts with the film on the surface of the substrate to facilitate polishing. The interaction of the polishing pad, the abrasive particles, and the reactive agent with the surface of the substrate results in controlled polishing of the desired film.

The carrier uses a retaining ring in order to restrict lateral movement of the substrate as it is pressed against the polishing pad. The rotation of the polishing pad produces a substantial frictional force on the substrate surface that urges the substrate in the direction of the rotation. Therefore, it is inherent in the design of conventional CMP devices that the substrate will come into intimate contact with the retaining ring. Contact between the substrate and retaining ring can occur under significant force and can also involve some friction or impact. Under these conditions, the substrate edge can become cracked, chipped or otherwise damaged.

While the inner surface of the retaining ring contacts the substrate, the lower face of the retaining ring is in intimate contact with the polishing pad and the slurry. Contact with the polishing pad results in erosion of the retainer's lower surface, thereby requiring frequent replacement. As an example, one material presently used in the construction of retainers is DELRIN®, a registered trade name of E.I. DuPont Co. Retainers made of DELRIN® typically wear out after processing between about 300 and about 500 substrates, thereby requiring frequent replacement due to their high wear rate. In addition to high wear rates, another concern regarding retainers is the generation of potentially harmful particles in the system which may damage or scratch the substrate and compromise the integrity of devices formed on the substrate.

Therefore, there exists a need to characterize and provide a retaining ring and a material for its composition that is resistant to both the chemical and mechanical attack of the CMP environment and that does not damage the polishing pad. It would be desirable if the material was resistant to the mechanical forces of polishing, but would not adversely affect the edge of the substrate or compromise the integrity of the polishing pad. Additionally, the material also should be chemically compatible with the slurry composition so that the material will not break down in the polishing environment.

One such material for retainers is a ceramic, with a particularly preferred material being alumina. The inventors have found that alumina is wear resistant, has low particle generation and preserves the integrity of the polishing pad. However, alumina is an extremely hard material, i.e., does not exhibit any significant resilience, and can easily cause chipping or scratching of the substrate edge or surface. Furthermore, even though the alumina wear rate is low, the alumina itself is brittle and can chip or break upon impact or friction with the substrate.

Therefore, there exists a need for a wear resistant retaining ring that prevents damage to the substrate, is resistant to both the chemical and mechanical attack of the CMP environment, does not damage the polishing pad, and does not chip or otherwise damage the substrate on contact. It would be desirable if the retaining ring were made of materials that were resistant to the chemical and mechanical attack of the chemical mechanical polishing environment, and would protect the edge of the substrate and maintain the integrity of the polishing pad.

The present invention generally provides a retainer, e.g. a retaining ring for use in chemical mechanical polishing. The retaining ring includes a liner or insert formed or located on the inner diameter of the retaining ring to prevent chipping or scratching of the substrate edge. Preferably, the ring is made of a ceramic, such as alumina, and the liner or insert is made of a polymer that is resistant to the CMP environment. The preferred polymer liner or coating is comprised of an epoxy, polyimide, polyamideimide, polyetherketone or mixtures thereof, with the most preferred liner comprising a coating of epoxy.

BRIEF DESCRIPTION OF THE DRAWINGS

So that the above recited features and advantages of the present invention can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 6 is a table comparing material hardness with material wear rates under chemical mechanical polishing conditions;

DETAILED DESCRIPTION OF THE PREFERRED EMBODIMENT

Figure 1:
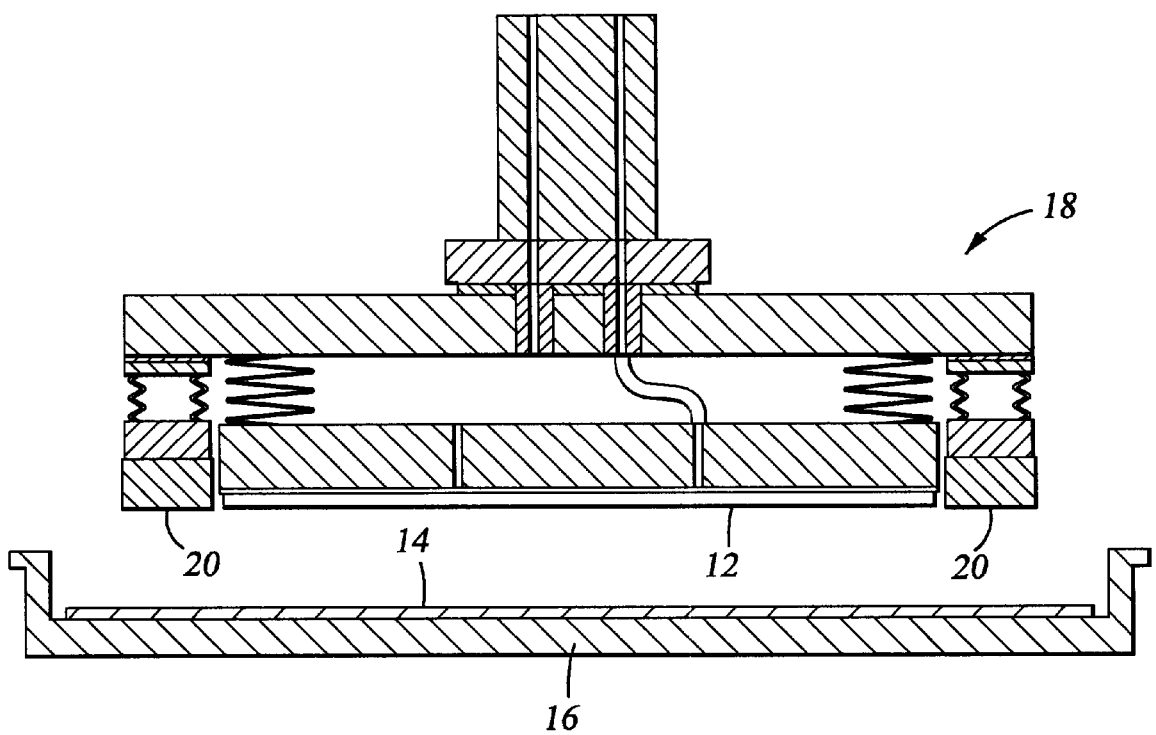
FIG. 1 is a cross-sectional view of a polishing head having a substrate retainer.

The present invention provides a retaining ring having a resilient liner that protects the substrate edge from being damaged during chemical mechanical polishing. Retainers made of wear resistant ceramics, such as alumina, provide better overall performance than other retaining ring materials, including improved wear resistance on contact with a CMP polishing pad and lower particle formation. Furthermore, alumina is not prone to cutting or otherwise damaging the polishing pad. However, alumina is so hard and rough that retainers made from alumina have an inner surface facing the substrate that is extremely abrasive.

As described above, rotation of the polishing pad produces a substantial frictional force on the substrate surface that urges the substrate in the direction of the pad rotation against the retaining ring. The inherent contact between the substrate and retaining ring can occur under significant force and can also involve some friction or impact. Because alumina is hard and rough, the substrate edge can easily become cracked, chipped, scratched or otherwise damaged.

While the inner surface of the retaining ring contacts the substrate, the face of the retaining ring is in intimate contact with the polishing pad and the slurry. Pressing the retaining ring against the polishing pad results in erosion of the retaining ring surface and the generation of potentially harmful particles which may scratch the substrate and compromise the integrity of devices formed on the substrate. Retainers made of alumina have been found to exhibit wear at a rate of about one micron/minute under typical CMP conditions as shown in the examples which follow. Furthermore, alumina retainers have been shown to provide improved edge exclusion. The term "edge exclusion", as used herein, refers to the uniformity of polishing near the edge of the substrate. It is believed that the improved edge exclusion provided by alumina may be due to reduced ringing in the pad. The term "ringing in the pad", as used herein, refers to any movement of the polishing pad under pressure, including vibrations, gyrations, bouncing, rebounding and the like. It is not yet understood exactly why alumina provides better edge exclusion than the other materials tested.

According to the present invention, a liner or coating is located or formed on the inner surface of the retaining ring to prevent damage to the substrate edge caused by contact with the retaining ring, while allowing independent selection of wear resistant materials, such as alumina, for contacting the polishing pad in accordance with the CMP environment. Preferably, the liner film, layer or coating is formed directly on the inner surface of the retaining ring. In another embodiment, a pre-fabricated insert ring is positioned within the inner diameter of the retaining ring. In either embodiment, the portion of the retaining ring that contacts the polishing pad comprises a wear resistant material described herein and a more pliable substrate-contacting portion comprises a softer, more resilient and/or smoother material than the retaining ring material, such as a polymer.

The preferred substrate-contacting portion comprises a polymer liner or coating selected from an epoxy, polyimide, polyamideimide, polyetherketone or mixtures thereof. The most preferred liner material is an epoxy. The epoxy coating in accordance with the present invention may be applied with a brush, spray nozzle or other means, preferably over a primer, and allowed to dry or cure. These epoxies are most preferably between about 60 and about 95 percent cross-linked, with between about 80 and about 90 percent cross-linking being most preferred. Once the epoxy coating is formed, the coating can be machined and polished to form a smooth inner surface for the retaining ring. Other suitable liner materials include fluorinated ethylene propylene (FEP), ethylene-chlorotrifluorthylene (HALAR®) and polytetrafluorethylene (available under the trademark TEFLON® from Du Pont de Nemours, E.I. & Co., Wilmington, Del.).

A particularly preferred process for bonding a liner to a retaining ring includes the steps of: (1) cleaning and drying the retaining ring, (2) applying and curing a primer on the retaining ring's pad contacting surface, (3) applying an epoxy over the primer, and (4) curing the epoxy. Such process can produce an epoxy film having a Shore D hardness of 75 or more.

EXAMPLE 1

An alumina ring, obtained from Applied Ceramics, Freemont, Calif. was pre-cleaned in an ultrasonic cleaner. Handling of the rings was minimized and gloves were worn at all times. The rings were dipped in a solution of potassium hydroxide (KOH) at a pH between about 13 and about 14 for about 2 minutes. The rings were then thoroughly rinsed with de-ionized (DI) water. The primary purpose of the above cleaning steps was to remove any organic materials from the surface of the rings.

The rinsed rings were placed into an oven to dry at about 250° C. for about one hour. The dry rings were then cooled down to room temperature (between about 20° and about 30° C.).

A primer was applied over the inner surface of the retaining ring with a sponge-tip until a primer thickness of at least one monolayer, but preferably between about 6 and about 8 monolayers, was obtained. The primer was a synthetic resin material in a methyl alcohol solvent, available from 3M Corporation, St. Paul, Minn. under the product number 3M 3901. This primer contains a red dye which, at the thicknesses described above, will begin to be visible with a pink tint.

An alternative process for applying the primer was utilized on a portion of the retainers. This alternative process included applying a thick layer of the same primer with a sponge-tip, waiting between about 2 and about 5 minutes, then rinsing the primer with ethanol.

All of the retainers, including rings with primer layers formed by both processes, were heated to about 110° C. for about 1 hour. This heating is believed to drive off unreacted volatile components of the primer solution which could interfere with the bonding between the primer and the subsequent epoxy liner. After heating, the rings were allowed to cool down to room temperature (between about 20° and about 30° C.).

Once the rings were at about room temperature, a polymer film was immediately applied. The polymer included an epoxy base and an amine accelerator in a volumetric ratio of about 2:1 epoxy to amine, available from 3M Corporation, St. Paul, Minn. under the product number DP-460. The uncured epoxy coated ring was placed under a vacuum for between about 2 and about 5 minutes to remove any large bubbles in the film. The ring was then removed from the vacuum and placed in a curing oven for about 2 hours at a temperature of about 80° C. For the epoxy used, this curing procedure provided at least about 80% cross-linking.

Upon cooling, the hardness of the epoxy films were tested and found to possess a Shore D hardness of at least 75.

However, the overall performance of the pad-contacting portion of the retaining ring is not determinable simply by examining the hardness and chemical resistance, alone or in combination. Rather, the performance of the pad-contacting portion is a complex phenomena that is not completely understood. It is believed that the performance may be affected by a number of interrelated factors including the type of polishing pad, the type of abrasive in the slurry, the slurry pH, the reactions occurring at the substrate surface, and the polishing pad rate of travel. The lack of understanding, and the numerous variables, greatly complicates the design of retainers, as well as other CMP system components, and the selection of an acceptable material for their construction.

A series of experiments were designed and conducted to characterize materials for the pad-contacting portion of retainers. The following examples describe those experiments and are helpful for gaining a full understanding of the present invention.

EXAMPLE 2

A chemical mechanical polishing apparatus was configured with a 24 inch polyurethane polishing pad mounted on a platen and rotated at a rate of 60 rotations per minute (RPMs). A slurry comprising 12% solid glass ($SiO_2$) particles ranging in diameter from about 20 nanometers to about 450 nanometers (um) and potassium hydroxide (KOH) and having a pH of about 11 was applied to the polishing pad at a rate of 150 milliliters per minute (ml/min). A polishing head was prepared to hold up to four separate coupons made of selected materials against the polishing pad at a constant pressure. Grooves having a depth of about 150 mils were formed in the coupons in a cross-pattern to enable subsequent measurement of the amount of material removed from the coupon during the polishing process.

Figure 5:
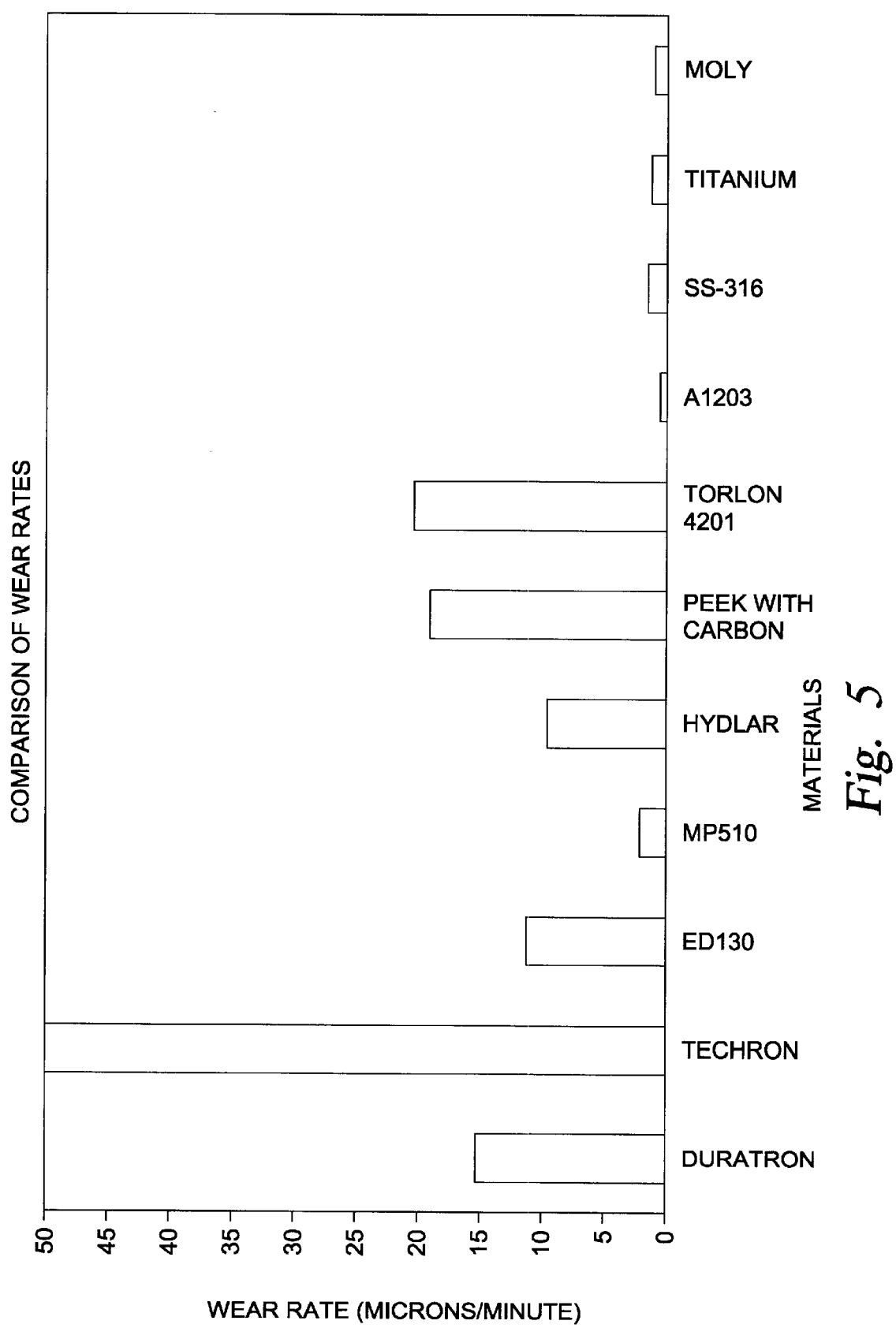

Referring to the bar chart of FIG. 5, under the test conditions described above, alumina ($Al_2O_3$) and a tetrafunctional glass filed epoxy, MP510 (available from Allied Chemical, Inc. of New Jersey) exhibited a lower wear rate than did a polyimide (such as DURATRON® available from Polymer Corporation), a polyphenyl sulfide (such as TECHRON®) and a bifunctional glass filled epoxy (such as ED130 available from Allied Chemical of New Jersey).

In comparison of metals, it was further determined that molybdenum (Mo) provided a somewhat lower wear rate than titanium (Ti) or Type 316 stainless steel (typically comprising about 16% chromium, about 10% nickel, about 2% manganese, about 1% silicon, and about 2% molybdenum) under the test conditions described above. However, these materials tended to cut the polishing pad, thereby jeopardizing the polishing process.

EXAMPLE 3

Using the procedures and equipment of Example 2, the wear resistance of several additional materials was determined. The coupons were polished for a period of about 3 hours, and then removed from the polishing system so that the amount of material worn away during the polishing process could be determined. A wear rate was then calculated for each material based on the amount of material removed as a function of time, i.e., microns/minute. The results were then recorded in bar charts as shown in FIGS. 2–4.

Figure 2:
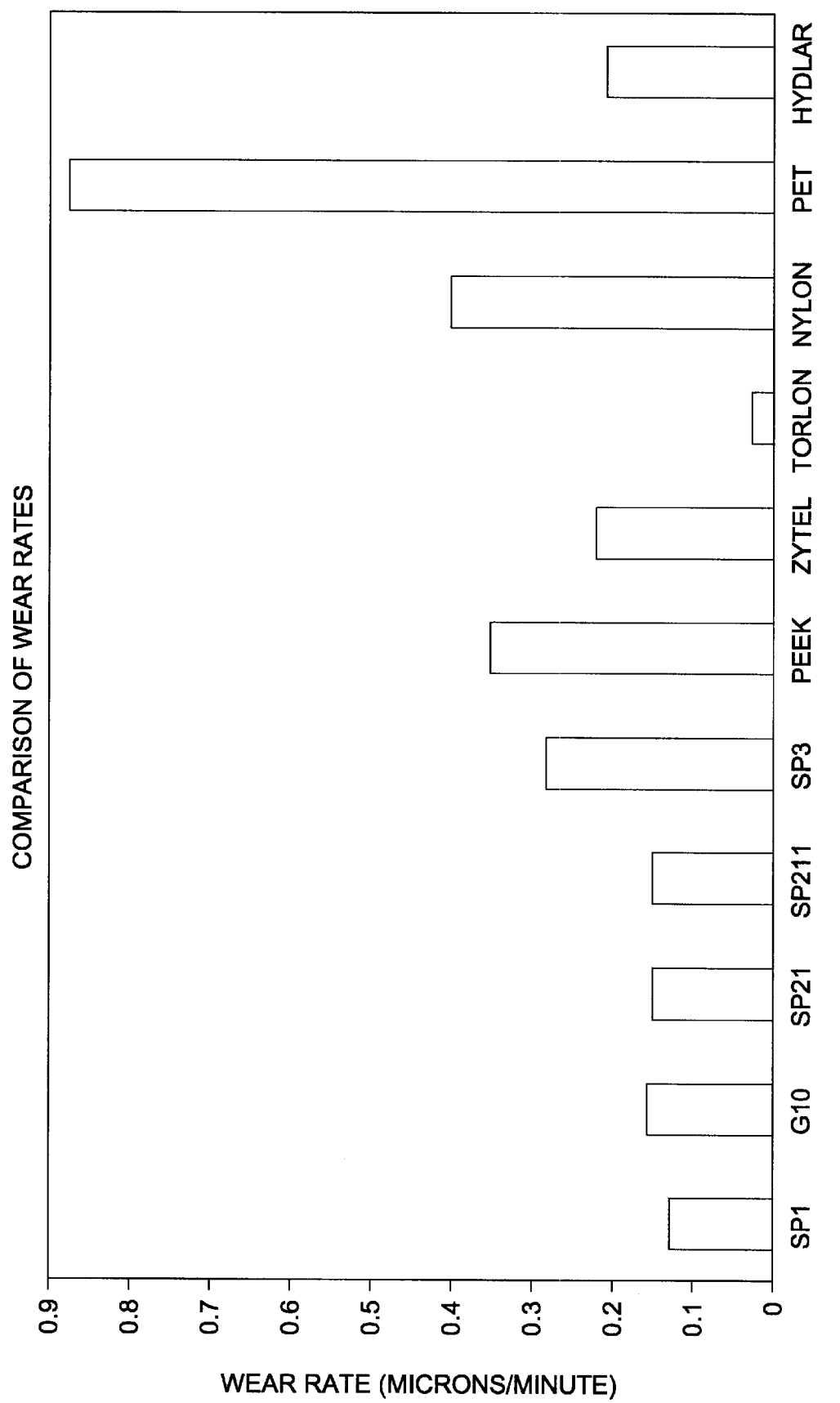
FIGS. 2–5 are bar charts comparing chemical mechanical polishing wear rates of various materials.
Figure 3:
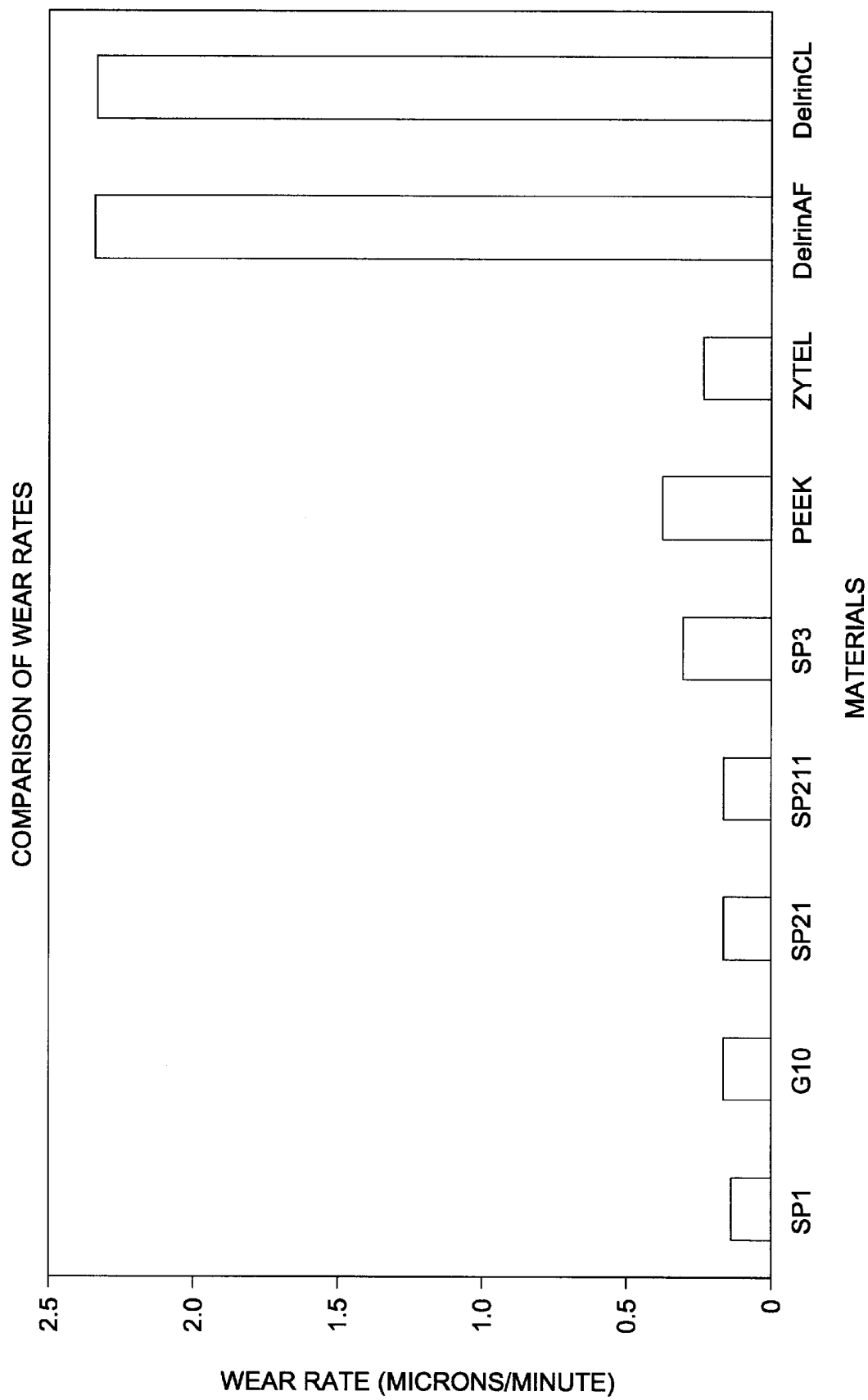
Figure 4:
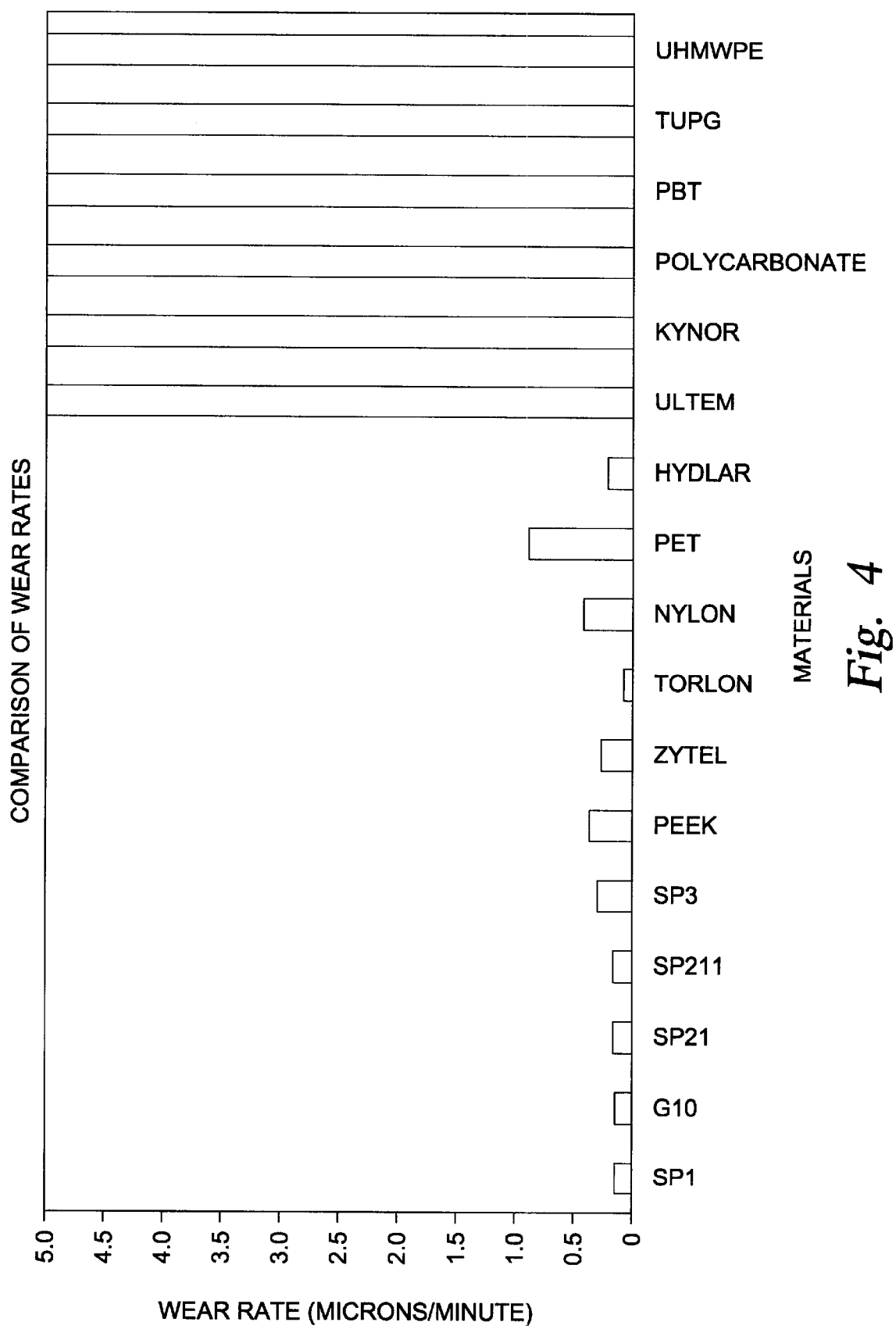

Referring to FIGS. 2–4, the wear resistance exhibited by each material is plotted for comparison, thereby illustrating which materials exhibit greater wear resistance (i.e., experienced the least amount of wear). The results show that the materials having the greatest wear resistance in the chemical mechanical polishing environment specified above, include polyamideimides (such as TORLON® available from Commercial Plastics & Supply Corp. of Miami, Fla.), aramides or polyimides (such as HYDLAR®, a trademark of Hyde Plastics of New Jersey and such as VESPEL® SP1™, SP21™ and SP211™, all trademarks of E.I. DuPont Nemours & Co. of Wilmington, Del.), glass filled epoxies (such as G-10, a NEMA grade phenolic epoxy plastic with glass cloth available from Commercial Plastics & Supply Corp.), nylon, and ZYTEL® (a trademark of E.I. DuPont Company).

It is interesting to note that the ultra high molecular weight polyethylene (UHMWPE), which is extremely resistant to attack under basic conditions, performed poorly when subjected to the polishing environment specified above. Furthermore, polyvinylidene fluoride (PVDF, known as KYNAR®), commonly believed to be chemically inert, thermally stable and abrasion resistant, did not perform well under the polishing conditions. Other materials exhibiting poor performance included polycarbonate, polyetherimide (such as ULTEM®, a trademark of General Electric), and polybenzothiophene (PBT).

In accordance with the results of Examples 2 and 3, alumina experienced extremely low wear compared to carbon-filled polyetheretherketone (PEEK with carbon) as well as to TORLON® and HYDLAR®, which are among the most wear resistant materials set out in Example 3. Alumina was therefore, deemed to be the most preferred material because it exhibited greater wear resistance, good substrate edge exclusion performance, and low particle generation without damaging the polishing pad. While it will be recognized that an alumina retaining ring may be constructed in many different ways within the scope of the invention, a preferred retaining ring uses a stainless steel member on which alumina is bonded with an epoxy cement.

While alumina was found to be the preferred material, it was discovered that rings made of alumina are so hard and brittle that after about three minutes of polishing, the substrate had been scratched, and occasionally chipped, at the substrate edge by the relatively rough surface of the alumina retainer. Therefore, a liner or insert ring was formed or located on the inner surface of the retaining ring to prevent damage to the substrate edge, while maintaining the advantageous wear resistant characteristics of alumina along the pad contacting face of the retaining ring as shown in FIG. 1.

Figure 8:
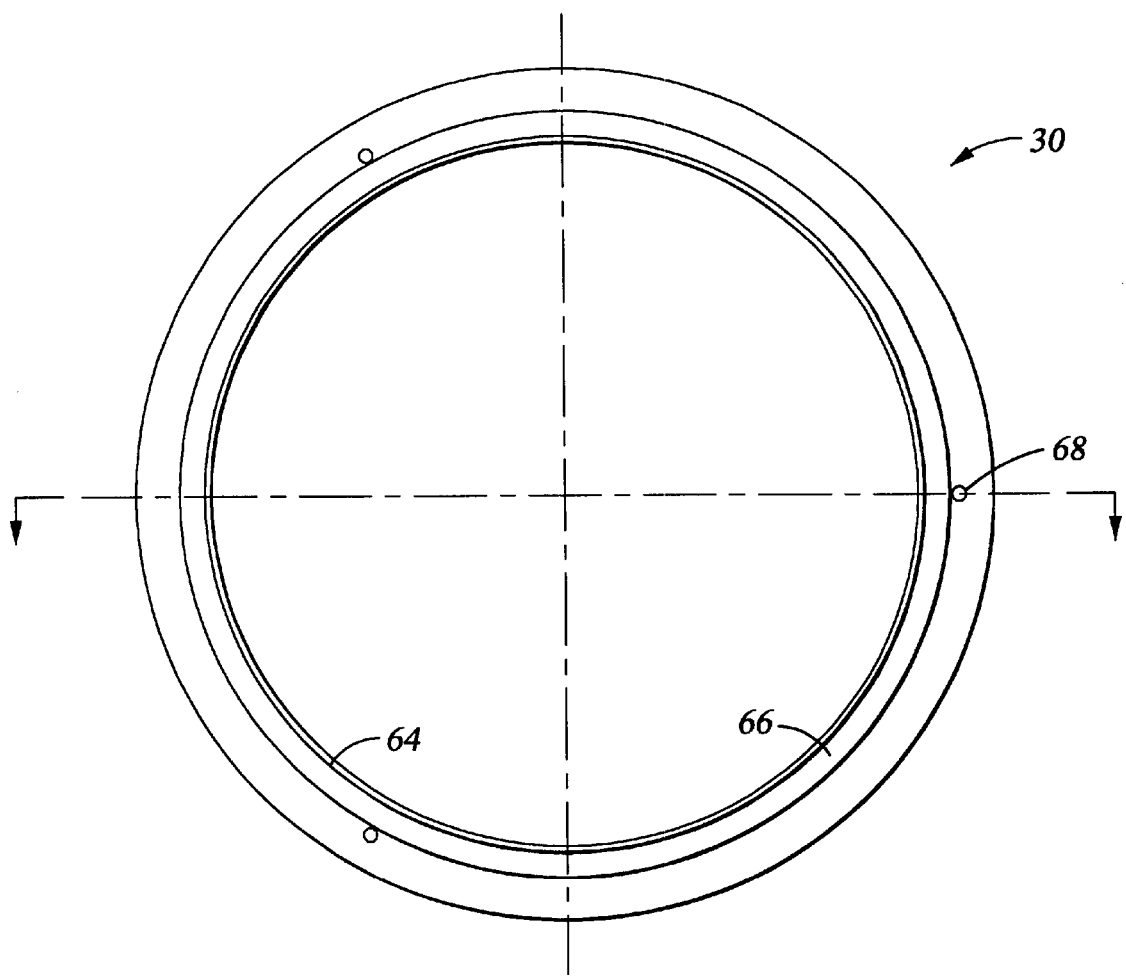
FIG. 8 is a bottom view of a lined retaining ring of the present invention.
Figure 9:
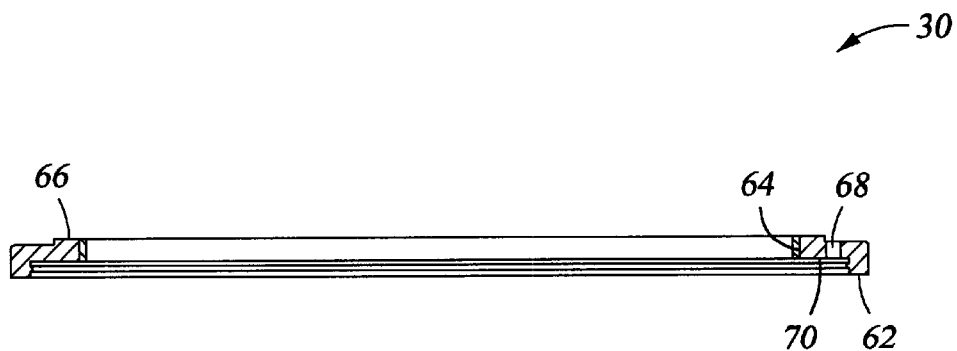
FIG. 9 is an upside-down, cross-sectional view of the lined retaining ring of FIG. 8 taken along line 9—9.

Now referring to FIGS. 8 and 9, a bottom view and upside down cross-sectional side view of a lined retaining ring 30 of the present invention are shown. The ring 30 has a substantially planar pad-contacting portion or surface 66 made of a wear resistant material, such as alumina, and a resilient liner 64 located on the inner surface of the ring to form the substrate-contacting portion or surface 70. A plurality of holes 68 are provided for securing the ring 30 to a downwardly actuated member 22 (See FIG. 10).

Figure 10:
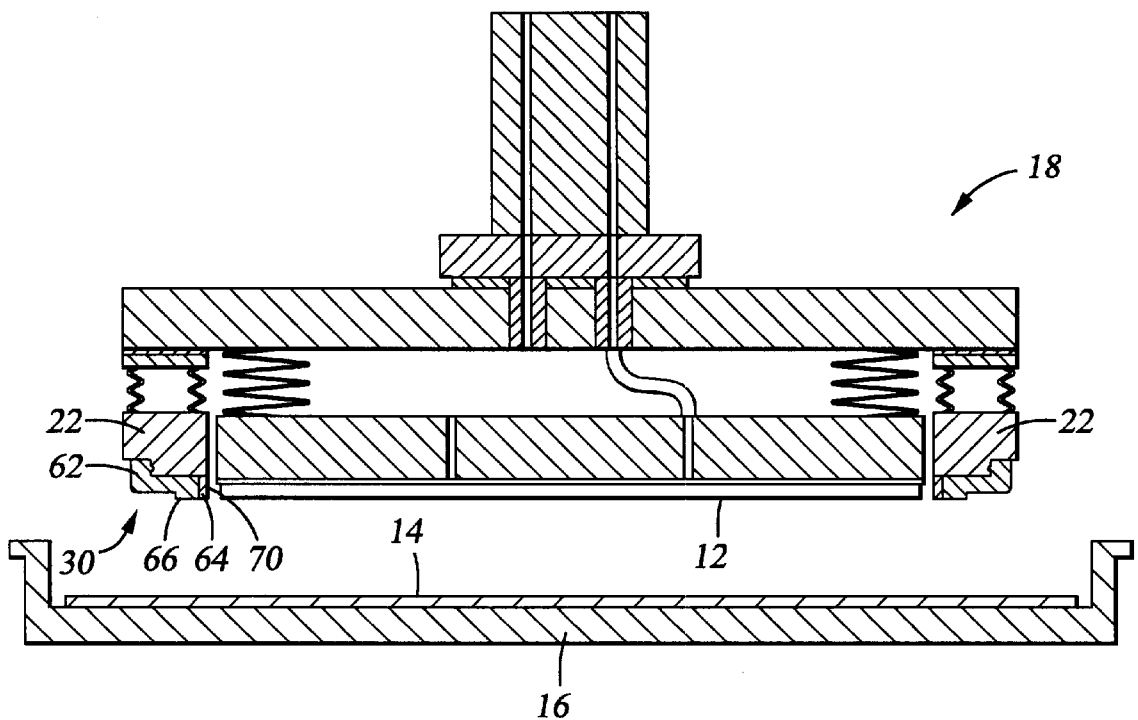
FIG. 10 is a cross-sectional view of a polishing head having a substrate retaining ring with a liner of the present invention attached thereto.

Now referring to FIG. 10, a cross-sectional view of a polishing head 18 is shown having a substrate retaining ring 30 with a liner 64 of the present invention attached thereto. Note that the pad-contacting portion or surface 66 faces the polishing pad 14 and the substrate-contacting portion or surface 70 surrounds the substrate 14. In a preferred embodiment, the ring 30 has a lip 62 that mates with a groove in the downwardly actuated member 22 to facilitate a stable connection and precise alignment thereto. It is also preferred to limit the surface area of the pad-contacting portion 66 so that the inner, bottom corner of the ring 30 more easily maintains contact with the substrate edge. The limited surface area may also reduce the amount of particles generated.

In another aspect of the invention, the liner 64 may be a prefabricated ring positioned within the inner diameter of the retaining ring and fastened to the ring 30. Regardless of whether the liner is prefabricated or formed in place, the present invention allows the pad-contacting and substrate-contacting portions to be selected independently. Therefore, it is preferred that the pad-contacting portion of the retaining ring be comprised of a wear resistant material described herein and the substrate-contacting portion be comprised of a soft, resilient or smooth material, such as a polymer liner. Exemplary polymers for use as liners include polyurethane, polytetrafluoroethylene (PTFE), fluorinated ethylene propylene, epoxies, ethylene chlorotrifluorethylene (HLAR®), polyimides, polyamideimides, polyetherketone, and combinations thereof, as well as other chemically and mechanically compatible materials. The most preferred liner or coating comprises an epoxy.

It is further believed by the inventors that the grain size of the material forming the substrate-contacting portion of the retaining ring is substantially responsible for damage caused to the substrate edge. Materials having uniform grain size provide less abrasion than materials which are comprised of variable grain sizes. It is also believed that as larger grains are abraded, scratching of the substrate surface may occur. Accordingly, the preferred substrate contacting portion of the retainer comprises small grain sizes, and/or uniform grain sizes. Most preferably, the substrate-contacting portion comprises both small and uniform grain sizes.

Figure 7:
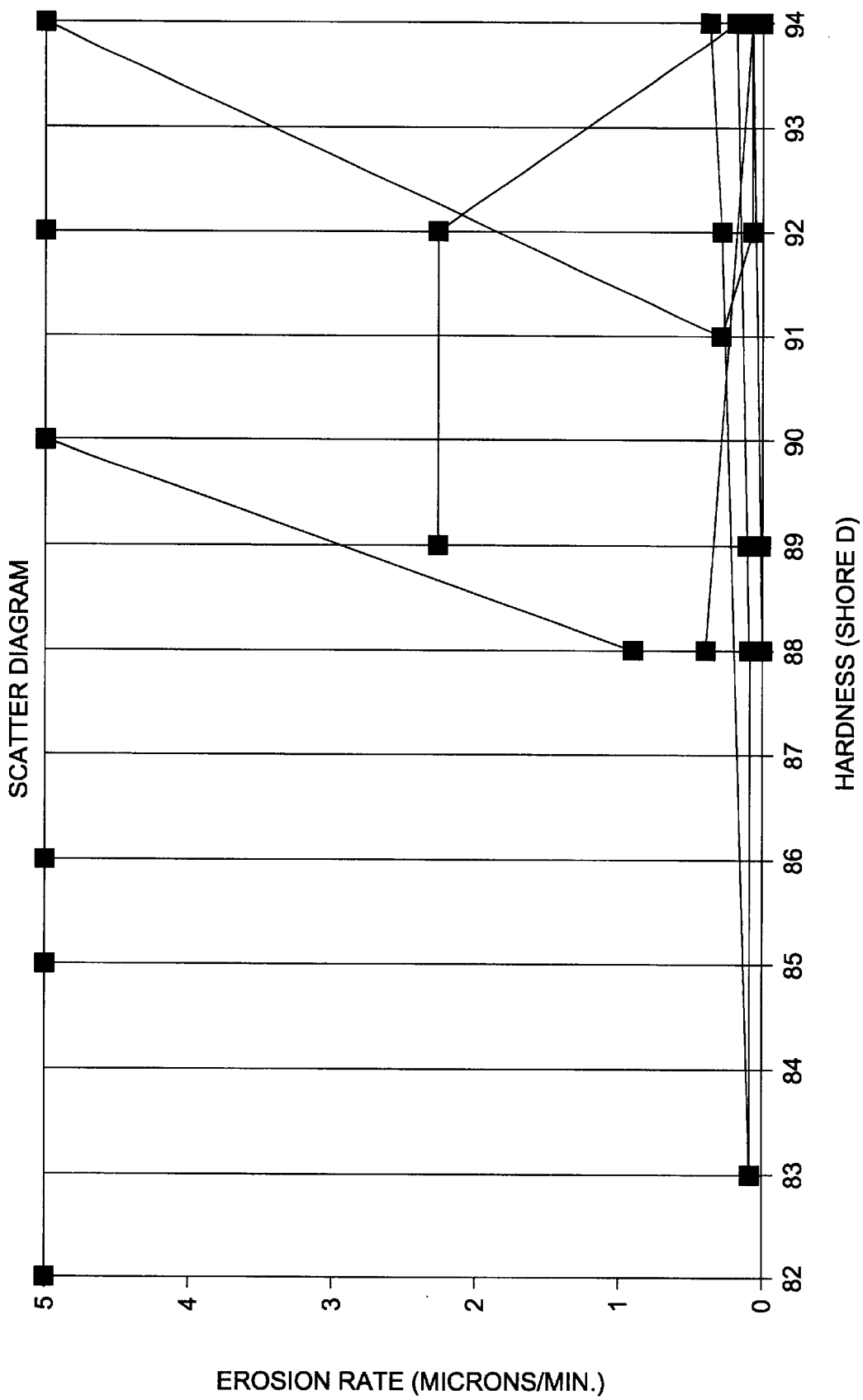
FIG. 7 is a scatter diagram showing the lack of correlation between material hardness and material wear rates under chemical mechanical polishing conditions.

In an attempt to characterize the preferred materials demonstrating the best wear resistance, the shore D hardness of each material was compared to the wear rate determined in the examples. FIG. 6 is a tabulation provided to show the numerical wear rates of the various materials tested as compared to the shore D hardness of the material as found in the literature. The data of FIG. 6 was then used to prepare a scatter diagram shown in FIG. 7 plotting the wear rate as a function of shore D hardness. The scatter diagram shows that there is no apparent relationship between the hardness of a material and the wear resistance of a material in the CMP environment provided in the examples. In fact, a wear resistance of less than about 0.5 microns per minute was obtained for materials having a hardness varying anywhere from between about 83 to about 94 on the shore D hardness scale. Further, DELRIN® 500CL having a shore D hardness value of 92 exhibited a wear rate of 2.3 microns/minute, while SP211 having a shored D hardness of 83 exhibited a wear rate of 0.1 microns/minute. It was concluded that the durability of a material in a CMP process, specifically wear resistance, cannot be predicted or determined based on hardness alone; other unknown factors play a significant role.

Analysis of the data collected, therefore, shows that CMP system components, particularly retainers, are preferably made from polyimides, polyetheretherketones, polyetherimides, polyamideimides, glass filled epoxies or ceramics, such as alumina ($Al_2O_3$), with the most preferred material being alumina. It is preferred that the alumina, or other ceramic, have a uniform grain size to reduce particle generation or other damage to the substrate. Furthermore, it is preferred that the alumina be of the highest purity to eliminate harmful contaminants, such as iron (Fe).

While the foregoing is directed to a preferred embodiment of the present invention, other and further embodiments of the invention may be devised without departing from the basic scope thereof, and the scope is determined by the claims which follow.

What is claimed is:

1. An apparatus for securing a substrate against a polishing pad during chemical mechanical polishing, comprising:
    a) a ring having an inner surface and a polishing-pad-contacting surface, wherein the ring comprises a wear resistant material; and
    b) a resilient material disposed on the inner surface of the ring that is different than the wear resistant material, wherein the resilient material comprises a primer layer and a substrate contacting layer.

2. The apparatus of claim 1, wherein the wear resistant material comprises alumina.

3. The apparatus of claim 2, wherein the resilient material comprises a polymer.

4. The apparatus of claim 1, wherein the wear resistant material is selected from the group consisting of ceramim, polyimides, polyamideimides, polyetherketones, and combinations thereof.

5. The apparatus of claim 1, wherein the resilient material comprises a polymer.

6. The apparatus of claim 1, wherein the resilient material is selected from the group consisting of polyimides, polyamideimides, polyetherketones, epoxies, polytetrafluoroethylene, polyurethanes, and mixtures thereof.

7. The apparatus of claim 1, wherein the resilient material is selected from the group consisting of epoxy, fluorinated ethylene propylene, ethylene-chlorotrifluoroethylene, and polytetrafluoroethylene.

8. A method of preparing a retaining ring, comprising:
    applying a primer film on the retaining ring;
    applying an epoxy coating over the primer;
    disposing the epoxy coated retaining ring in a vacuum to remove bubbles in the epoxy; and then
    curing the epoxy coating.

9. The method of claim 8, further comprising:
    rinsing the retaining ring with deionized water; and
    drying the retaining ring by evaporative heating.

10. The method of claim 8, wherein time epoxy coating is cured to obtain a Shore D hardness of at least 75.

11. The method of claim 8, further comprising:
    rinsing the primer with ethanol.

12. A retaining ring for securing a substrate against a polishing pad during chemical mechanical polishing, comprising:
    a polishing-pad-contacting portion comprising a wear resistant material; and
    a substrate contacting portion disposed on the inner surface of the polishing-pad-contacting portion, wherein the substrate-contacting portion comprises a resilient material that is different than the wear resistant material, wherein the resilient material comprises a primer layer and a substrate contacting layer.

13. The retaining ring of claim 12, wherein the substrate contacting layer comprises an epoxy.

14. The retaining ring of claim 13, wherein the epoxy has a Shore D hardness of at least 75.

15. The retaining ring of claim 12, wherein the primer layer has a thickness between about one and about 10 monolayers.

16. The retaining ring of claim 12, wherein the wear resistant material is selected from the group consisting of ceramics, polyimides, polyamideimides, polyetherketones and mixtures thereof.

17. The retaining ring of claim 12, wherein the resilient material is selected from the group consisting of polyimides, polyamideimides, polyetherketones, epoxies, polytetrafluoroethylene, polyurethanes, and mixtures thereof.

18. The retaining ring of claim 12, wherein the wear resistant material comprises alumina and the resilient material is selected from the group consisting of polyimides polyamideimides, polyetherketones, and mixtures thereof.

19. The retaining ring of claim 12, wherein the wear resistant material further comprises a filler selected from the group consisting of glass, carbon, and mixtures thereof.

20. The retaining ring of claim 12, wherein the wear resistant material comprises a glass filled epoxy, a NEMA grade plastic with glass cloth, or nylon.

21. The retaining ring of claim 12, wherein the resilient material is selected from the group consisting of epoxy, fluorinated ethylene propylene, ethylene chlorotrifluorethylene, and polytetrafluoroethylene, a NEMA grade plastic with glass cloth, nylon, and combinations thereof.

22. The retaining ring of claim 12, wherein the wear resistant material comprises alumina.

23. The apparatus of claim 1, wherein the substrate contacting layer comprises an epoxy.

24. The apparatus of claim 23, wherein the epoxy has a Shore D hardness of at least 75.

25. The apparatus of claim 1, wherein the primer layer has a thickness between about one and about 10 monolayers.

* * * * *

UNITED STATES PATENT AND TRADEMARK OFFICE
CERTIFICATE OF CORRECTION

PATENT NO. : 6,390,904 B1  
DATED : May 21, 2002  
INVENTOR(S) : Gleason et al.

Page 1 of 1

It is certified that error appears in the above-identified patent and that said Letters Patent is hereby corrected as shown below:

Column 5,
Line 37, please change "(um)" to -- (nm) --.

Column 8,
Line 29, please change "ceramim" to -- ceramics --.

Signed and Sealed this

Twenty-fourth Day of June, 2003

JAMES E. ROGAN
*Director of the United States Patent and Trademark Office*